United States Patent
Winer

(10) Patent No.: US 6,809,337 B2
(45) Date of Patent: Oct. 26, 2004

(54) LIQUID CRYSTAL DISPLAY DEVICES HAVING FILL HOLES AND ELECTRICAL CONTACTS ON THE BACK SIDE OF THE DIE

(75) Inventor: Paul Winer, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/128,602

(22) Filed: Apr. 22, 2002

(65) Prior Publication Data

US 2003/0197816 A1 Oct. 23, 2003

(51) Int. Cl.[7] .............................................. H01L 29/04
(52) U.S. Cl. ......................... 257/72; 257/59; 257/708; 257/774; 257/347
(58) Field of Search ........................... 257/72, 59, 708, 257/774, 347

(56) References Cited

U.S. PATENT DOCUMENTS

| | | | |
|---|---|---|---|
| 5,576,630 A | 11/1996 | Fujita | |
| 5,614,839 A | 3/1997 | Bosacchi | |
| 5,694,053 A | 12/1997 | Smith | |
| 5,757,057 A | * | 5/1998 | Dabrowsky |
| 5,834,327 A | 11/1998 | Yamazaki et al. | |
| 5,919,070 A | * | 7/1999 | Khan et al. |
| 6,071,755 A | 6/2000 | Baba et al. | |
| 6,111,424 A | 8/2000 | Bosacchi | |
| 6,195,149 B1 | 2/2001 | Kodera et al. | |
| 6,208,405 B1 | 3/2001 | Sakong et al. | |
| 2002/0159020 A1 | 10/2002 | Sojurner et al. | |

* cited by examiner

*Primary Examiner*—Fetsum Abraham
(74) *Attorney, Agent, or Firm*—Kenneth J. Cool

(57) ABSTRACT

A method of fabricating LCOS devices and testing them at the wafer-scale to identify known-bad dice, to facilitate completing fabrication of only known-good dice. A wafer-scale transparent electrode glass is temporarily placed over the wafer, and liquid crystal material is injected into the LCOS device cavities through fill holes extending through the wafer. After removing the glass and separating the wafer into dice, only the good dice have their die-scale glass attached, liquid crystal material re-injected, solder bumps affixed, and substrate attached.

14 Claims, 4 Drawing Sheets

US 6,809,337 B2

LIQUID CRYSTAL DISPLAY DEVICES HAVING FILL HOLES AND ELECTRICAL CONTACTS ON THE BACK SIDE OF THE DIE

BACKGROUND OF THE INVENTION

1. Technical Field of the Invention

This invention relates generally to manufacturing and testing of liquid crystal on semiconductor display devices, and more specifically to wafer-level testing and device structures that support such.

2. Background Art

Liquid crystal on silicon (LCOS) display devices include an array of display pixels fabricated on a silicon or other semiconductor substrate with associated control circuitry, and a quantity of liquid crystal material encapsulated overlying the display pixel array. When appropriate electrical signals are applied to the various pixels, they alter the transparency or polarization or reflectivity of the liquid crystal material which overlies their respective areas.

Unfortunately, at present, the LCOS chips must be fully fabricated and assembled before they can be tested. Of any given semiconductor wafer, there will typically be a number—sometimes a large number—of semiconductor dice which are defective and must be rejected. Overall costs are increased, materials are wasted, and factory output is reduced, by the ultimately unnecessary completion and assembly of these defective devices.

Also, on present LCOS devices, the wire bond attach pads are located on the same side of the die as the liquid crystal display structures. This makes testing difficult, and makes test head devices complicated and difficult to make and use.

What is needed, then, is a way to perform wafer-level testing of LCOS devices before their final fabrication steps and their assembly.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

Figure 1:
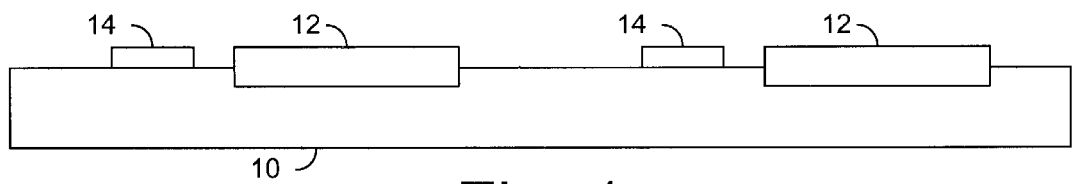
FIGS. 1–9 show various incremental stages of completion of a wafer of LCOS devices, according to one embodiment of the invention.

FIG. 1 illustrates a semiconductor wafer 10 that has a first side and a second side. A number of display pixel arrays 12 are fabricated on the first side of the wafer. For simplicity of illustration, only two display pixel arrays are shown. After manufacturing is complete, each display pixel array will typically occupy its own chip cut from the wafer. Each chip will have a plurality of external connections or external electrodes 14 such as bond pads for routing power, ground, and signals to the chip. For ease of illustration, only one external connection is shown for each of the display pixel arrays, but each display pixel array will typically have a large number of such external connections. The term "external electrode" is intended to signify an electrode which will carry a signal off-chip, not necessarily an electrode which is itself external to the chip or on the exterior surface of the chip.

Figure 2:
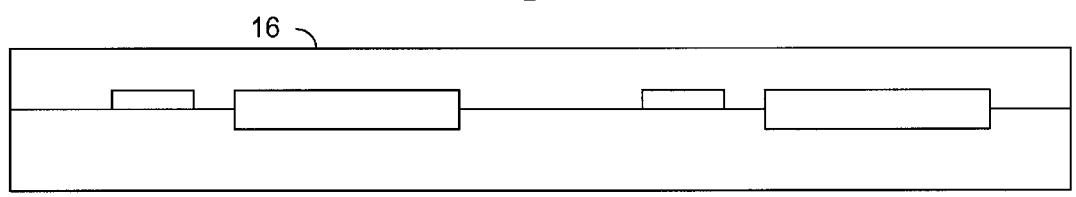

FIG. 2 shows a protective layer 16 which can optionally be formed overlying the display pixel arrays.

Figure 3:
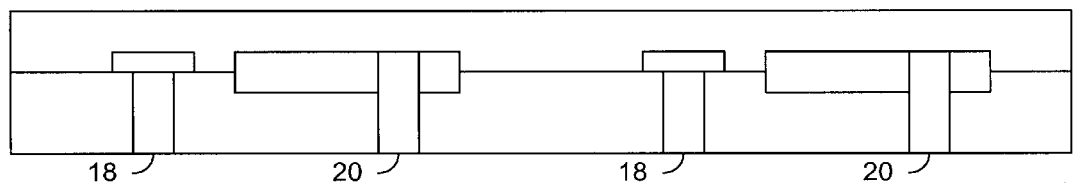

FIG. 3 shows an electrical via 18 formed through the semiconductor wafer from the second side to the first side and into contact with the external connector, and at least one liquid crystal fill via 20 formed through the semiconductor wafer. In various embodiments, any number of electrical vias and any number of liquid crystal fill vias can be formed. The vias can also be termed holes, and need not necessarily be formed in any particular manner, although one suitable method is by laser drilling. In some embodiments, the liquid crystal fill via(s) can be located so as to extend through the display pixel array, as shown, while in other embodiments, they can be located to the side of the display pixel array, while in still other embodiments, both locations can be used. Further discussion will omit repetitively pointing out that the various structures are formed for each display pixel array, in the interest of readability.

Figure 4:
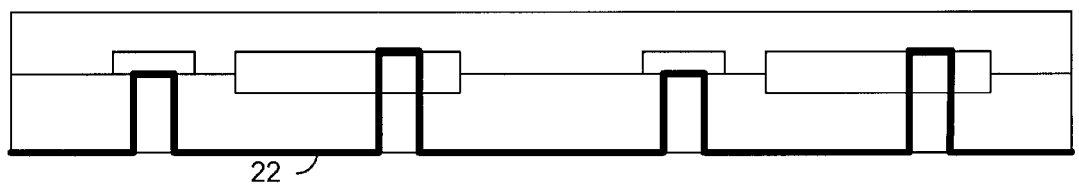

FIG. 4 shows a metal or other suitably conductive layer 22 formed so as to provide electrical contact with the external connectors. In one embodiment, the conductive layer is formed by depositing metal on the surface of the semiconductor substrate and the walls of the electrical via. In some embodiments, it may be acceptable to allow the metal to also line the liquid crystal fill via, while in other embodiments the liquid crystal fill via may be plugged prior to the metal deposition.

Figure 5:
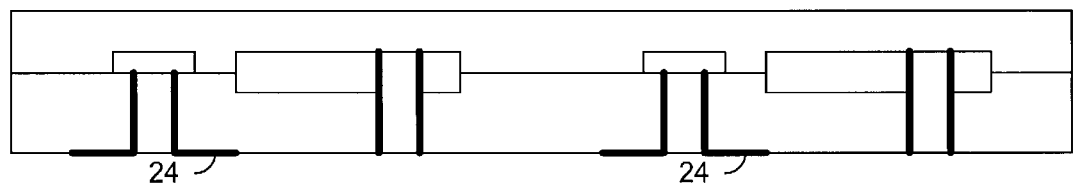

FIG. 5 shows patterning of the metal layer to form pads 24 or other suitable structures on the second side of the wafer and in contact with the electrical vias and appropriately not in contact with other structures, including each other.

Figure 6:
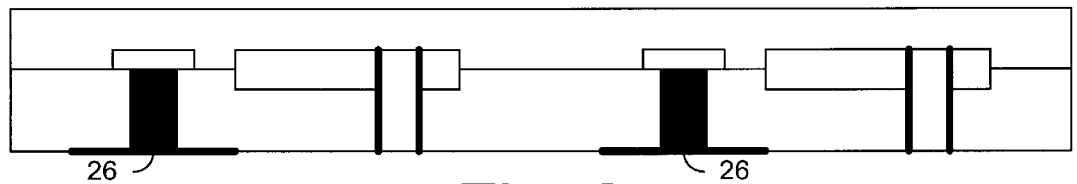

FIG. 6 shows a conductive plug 26 or conductor formed in the electrical via, to improve conductivity of the path to the external connector. The liquid crystal fill via is not plugged or, if it is plugged, the plug is subsequently removed.

Figure 7:

FIG. 7 shows the removal of the protective layer which had been overlying the display pixel array.

Figure 8:
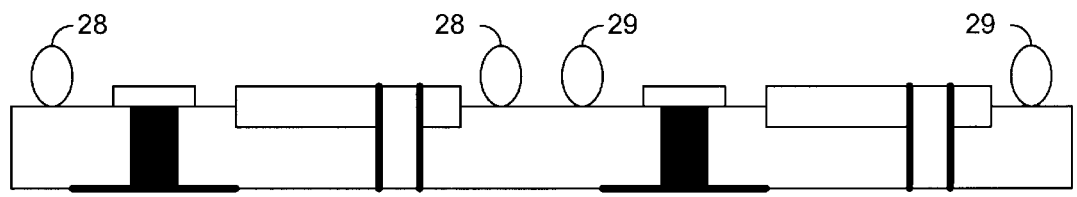

FIG. 8 shows the formation of seals 28, 29 surrounding respective display pixel arrays. The reader will appreciate that the seals are shown in cross-section, and that this is why there appear to be two seals for each. In some embodiments, a single seal may be used, surrounding the entire wafer; in such embodiments, individual seals will later be formed for individual display pixel arrays.

In the prior art, a seal was formed around a display pixel array, with a small gap somewhere in the perimeter of the seal, to facilitate injection of the liquid crystal material. In some embodiments of this invention, the seal can advantageously be monolithic or continuous without any such gap.

Figure 9:
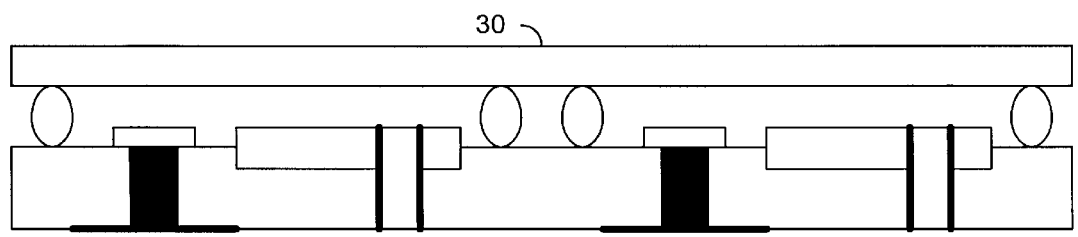

FIG. 9 shows a transparent electrode 30 placed to overlie the display pixel array and be in contact with the seal, encapsulating a cavity 31 between the transparent electrode and the wafer, with the seals defining a perimeter of the cavity for each LCOS device. In one embodiment, the transparent electrode is a layer of coated or impregnated glass. In one embodiment, the glass may be substantially the size of the wafer, so as to overlie all of the LCOS devices, while in other embodiments it may be smaller, in some cases as small as one separate glass for each LCOS device. The reader will appreciate that various details of the LCOS device have been omitted, such as the formation of logic circuitry and the like, and that these can of course be formed within the scope of this invention.

Furthermore, while the external contact 14 has been shown as being in the cavity, it could be located outside the cavity, beyond the perimeter of the seal. Also, while it has been shown as being in a top metal layer, it could be in a buried layer; with the electrical via extending to the surface of the back side of the wafer, there is no longer any need for the external contact to be on the top or otherwise externally accessible layer on the front side of the wafer.

Figure 10:
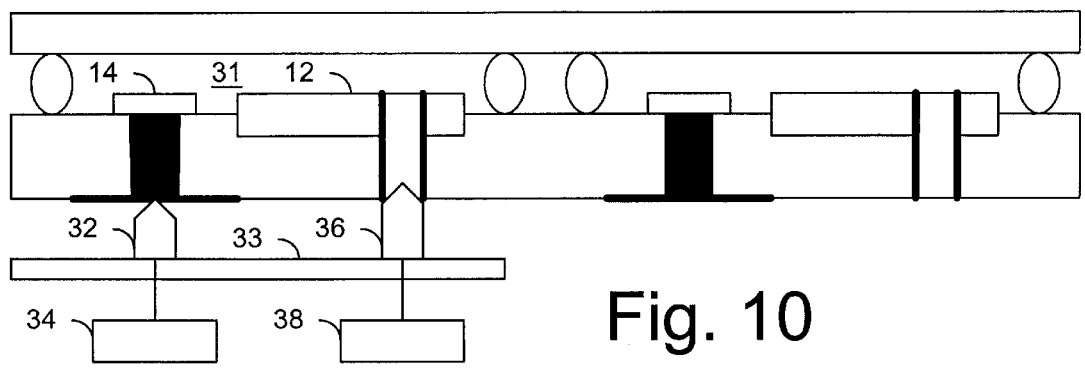
FIGS. 10–12 show various incremental stages of wafer-level testing of the wafer of LCOS devices, according to one embodiment of the invention.

FIG. 10 shows a testing probe card 33 which has an electrical probe 32 connected to electrical test logic 34 and a liquid crystal injection needle 36 connected to a reservoir 38 of liquid crystal material. In some embodiments, the electrical probe and the fill needle can advantageously be spaced such that the electrical probe contacts the electrical via or plug or associated pad, at the same time that the liquid crystal injection needle is in a suitable proximity to the liquid crystal fill via. In other embodiments, the electrical probe and the fill needle can be on separate probe cards and their operations performed at different times. In some embodiments, the probe card may contain multiple electrical probes for contacting all of the LCOS device's electrical vias at the same time. In some embodiments, the probe card may contain multiple fill needles, to utilize all of the LCOS device's fill vias. In some embodiments, the probe card can include electrical probes and fill needles for testing more than one LCOS device at a time. In one embodiment, the probe card contains an entire wafer's worth of electrical probes and fill needles.

It is significant to note that the probe card operates on the back side of the wafer, or the side opposite the liquid crystal structures. This can, in some embodiments, enable simplified construction or usage of the probe card. It can also, in some embodiments, enable the die size to be reduced to a size such that the front side of the chip does not have enough surface area external to the liquid crystal seal perimeter for placement of the requisite number of external contacts. In the extreme case, the chip can be reduced to the size of the seal perimeter.

Figure 11:
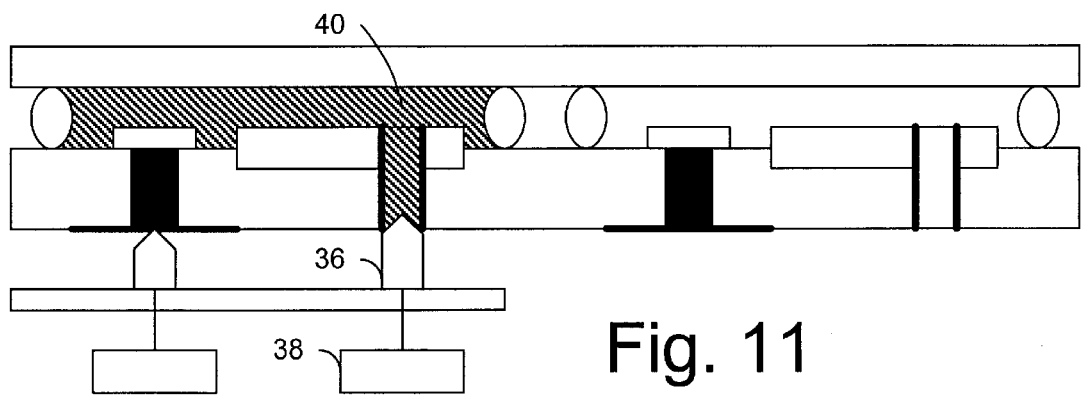

FIG. 11 shows the injection of the liquid crystal material 40 through the fill via. In some embodiments, the liquid crystal material can be withdrawn from the LCOS device and returned to the reservoir for reuse, such as if the LCOS device is defective. In other embodiments, it can simply be left in place from this stage of manufacturing onward.

Figure 12:
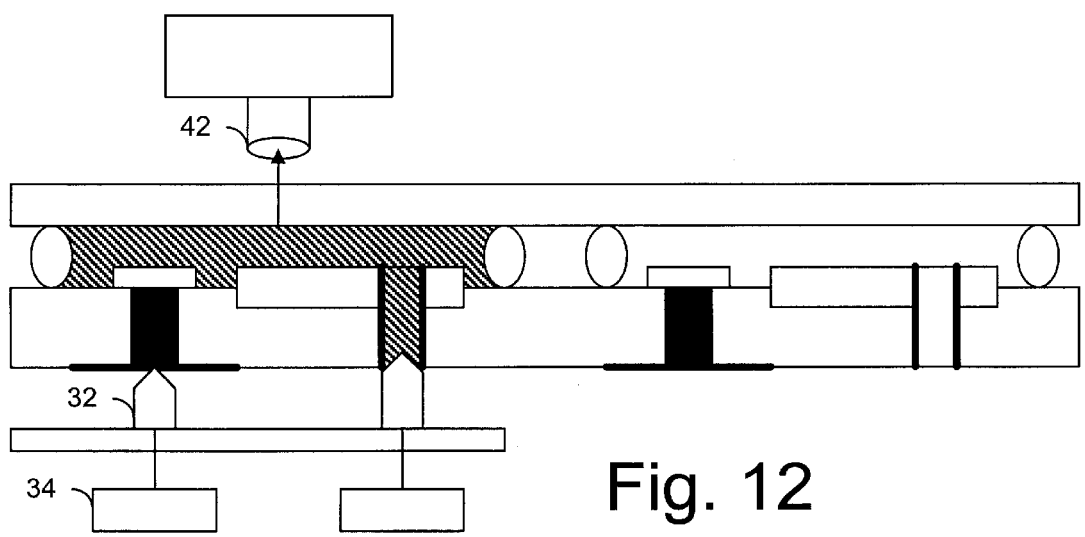

FIG. 12 shows the electrical and optical testing of the LCOS device. The test logic 34 drives the external contact with the electrical probe 32, and a visual inspection system such as a camera 42 or a human checks to see that the correct pattern, color, brightness, etc. are displayed in the liquid crystal material. In some embodiments, the test logic also checks the operation of other circuitry (not shown) on or associated with the LCOS device. Some of the external contacts may be used for outbound signals sent from the chip to the test device.

Figure 13:
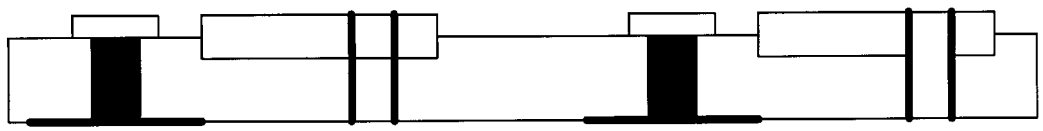
FIGS. 13–16 show various incremental stages of post-test completion and assembly of known-good LCOS dice, according to one embodiment of the invention.

FIG. 13 shows the optional removal of the liquid crystal material and the wafer-size glass, after testing is complete. In some other embodiments, the wafer-size glass is simply sectioned along with the wafer, and is left in place on the finished dice.

Figure 14:
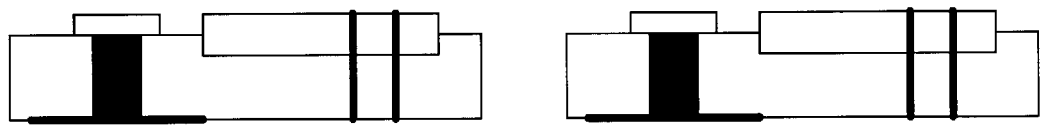

FIG. 14 shows the wafer having been sectioned into multiple dice, some of which are known-good and some of which are known-bad, in embodiments of the manufacturing methodology in which testing is done prior to wafer sectioning. The reader should note that the back side fill and test structures can be used after wafer sectioning, in addition to, or in lieu of, wafer-scale fill and testing.

Figure 15:
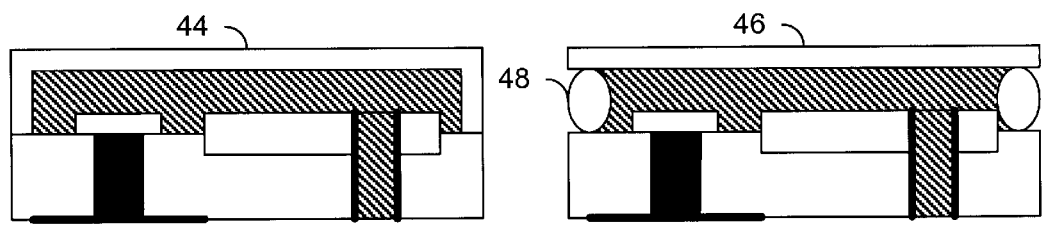

FIG. 15 shows, on the right side, a known-good die being completed by the addition of a seal 48 and a die-scale glass electrode 46. In some embodiments, the original seal may be retained. In some such embodiments, the wafer-scale glass is sectioned along with the wafer, and the glass electrode 46 is simply the piece of the original glass that was over this LCOS device. In some embodiments, the original liquid crystal material was never withdrawn; in others, liquid crystal material is again injected into the LCOS device. In some embodiments, one or more of the fill vias can be used to remove air while the liquid crystal material is injected through others, to avoid bubbles and obtain a complete fill. At some suitable stage, the fill vias are plugged or otherwise prevented from leaking.

FIG. 15 shows, on the left side, a known-good die being completed in a different manner, without the use of a seal. A monolithic glass structure 44 is formed or placed over the LCOS device in a self-sealing manner, such as by being deposited directly on the die or by being glued to the die.

Figure 16:
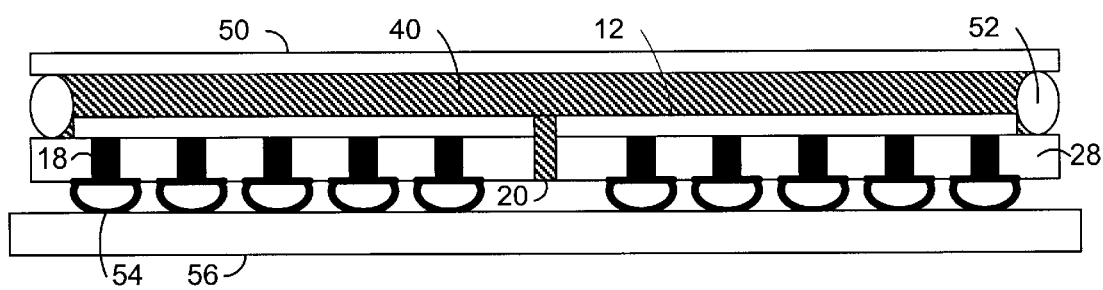

FIG. 16 shows the completion and assembly of a single LCOS device, which is not drawn to the same scale as the other FIGS. (The absolute or relative scale of the various FIGS. is not intended to have any particular significance, nor any effect upon the claims; the fact that FIG. 16 is drawn differently than e.g. FIG. 15 is merely pointed out so that the reader does not attempt to somehow vertically rationalize FIGS. 16 and 15.) The individual die 28 includes many electrical vias 18, and at least one fill via 20 through which the liquid crystal material 40 has been injected. The seal 52 (which can either be an originally placed seal 18 or a newly placed seal) supports the glass electrode 50 (again, either the original or a newly placed piece) and prevents the liquid crystal material from leaking. In some embodiments, solder bumps 54 are formed in contact with respective ones of the pads that provide connection to the typically smaller electrical vias. A substrate 56 is placed in contact with the solder bumps, and the solder bumps are flowed or melted to provide good connection between the LCOS device's via pads and corresponding pads (not shown) on the substrate. The substrate may contain other devices (not shown), such as passive components, semiconductor chips, and the like.

The reader will appreciate that the invention has been explained with reference to one simplistic exemplary embodiment, and that the invention is not limited to the specific details given above.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. A liquid crystal on semiconductor device comprising:
   a semiconductor die having a first side and a second side;
   a transparent electrode overlying the first side of the semiconductor die defining a cavity between the transparent electrode and the semiconductor die;
   a display pixel array in the cavity; and
   a hole extending through the semiconductor die from the second side to the first side into the cavity.

2. The liquid crystal on semiconductor device of claim 1 further comprising:
   liquid crystal material disposed in the cavity.

3. The liquid crystal on semiconductor device of claim 2 further comprising:
   an external electrode coupled to the display pixel array; and
   an electrical via extending from the second side of the semiconductor die to the external electrode.

4. The liquid crystal on semiconductor device of claim 3 further comprising:
   a seal disposed between the semiconductor die and the transparent electrode and encompassing the cavity.

5. The liquid crystal on semiconductor device of claim 4 wherein the seal is monolithic and continuous.

6. The liquid crystal on semiconductor device of claim 3 wherein the display pixel array includes a plurality of pixel display elements.

7. The liquid crystal on semiconductor device of claim 3 further comprising a plurality of external electrodes.

8. The liquid crystal on semiconductor device of claim 7 wherein all external electrical contacts are on the second side of the semiconductor die.

9. The liquid crystal on semiconductor device of claim 8 wherein the transparent electrode overlies substantially all of the first side of the semiconductor die.

10. A semiconductor wafer comprising:
    a plurality of LCOS devices formed on a first side of the semiconductor wafer and each having,
    a display pixel array,
    at least one external electrode,
    at least one electrical via extending from a second side of the semiconductor wafer to a respective external electrode, and
    at least one fill hole extending through the semiconductor wafer.

11. The semiconductor wafer of claim 10 further comprising:
    a transparent electrode overlying and encompassing a respective cavity over each of a plurality of the LCOS devices.

12. The semiconductor wafer of claim 11 further comprising:
    liquid crystal material in the cavity of at least one of the LCOS devices.

13. An LCOS chip comprising:
    a semiconductor die having a front side and a back side;
    a display pixel array overlying the front side of the semiconductor die;
    a transparent electrode layer overlying the display pixel array;
    a seal coupled to the front side of the semiconductor die and to the transparent electrode layer to enclose a cavity containing the display pixel array; and
    a fill hole extending from the back side of the semiconductor die into the cavity.

14. The LCOS chip of claim 13 further comprising:
    liquid crystal material disposed within the cavity; and
    a plug in the fill hole.

* * * * *